(12) United States Patent
Mok et al.

(10) Patent No.: US 12,136,580 B2
(45) Date of Patent: Nov. 5, 2024

(54) EMBEDDING METHODS FOR FINE-PITCH COMPONENTS AND CORRESPONDING COMPONENT CARRIERS

(71) Applicant: AT&S Austria Technologie & Systemtechnik Aktiengesellschaft, Leoben (AT)

(72) Inventors: Jeesoo Mok, Chongqing (CN); Artan Baftiri, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 287 days.

(21) Appl. No.: 17/657,541

(22) Filed: Mar. 31, 2022

(65) Prior Publication Data

US 2022/0319943 A1   Oct. 6, 2022

(30) Foreign Application Priority Data

Apr. 2, 2021   (CN) .......................... 202110363356.1

(51) Int. Cl.
*H01L 23/31*   (2006.01)
*H01L 21/48*   (2006.01)
(Continued)

(52) U.S. Cl.
CPC ........ *H01L 23/315* (2013.01); *H01L 21/4857* (2013.01); *H01L 23/5389* (2013.01);
(Continued)

(58) Field of Classification Search
CPC ............... H01L 23/315; H01L 21/4857; H01L 23/5389; H01L 24/16; H01L 24/32; H01L 2224/16227; H01L 2224/32225; H01L 23/49822; H05K 1/186; H05K 3/3436; H05K 1/183; H05K 3/243;
(Continued)

(56) References Cited

U.S. PATENT DOCUMENTS

2011/0159683 A1   6/2011   van den Brand et al.
2014/0246227 A1   9/2014   Lin et al.
(Continued)

FOREIGN PATENT DOCUMENTS

EP   3644693 A1   4/2020
JP   2006060150 A   3/2006
KR   100890217 B1   3/2009

OTHER PUBLICATIONS

Degroote, B.; Extended European Search Report in Application No. EP22166178.8; pp. 1-7; Dec. 21, 2022; European Patent Office; 80298 Munich, Germany.

*Primary Examiner* — Douglas W Owens
(74) *Attorney, Agent, or Firm* — Robert A. Blaha; Smith Tempel Blaha LLC

(57) ABSTRACT

A method of manufacturing a component carrier includes: (i) embedding a poorly adhesive structure in a stack, wherein the stack comprises at least one electrically conductive layer structure and/or at least one electrically insulating layer structure; (ii) forming a cavity in the stack by removing a stack piece, wherein the stack piece is in part delimited by the poorly adhesive structure; and (iii) selectively exposing a bottom of the cavity by partially removing the poorly adhesive structure. A corresponding component carrier includes analogous features.

18 Claims, 4 Drawing Sheets

(51) Int. Cl.
*H01L 23/00* (2006.01)
*H01L 23/538* (2006.01)
*H05K 1/18* (2006.01)
*H05K 3/34* (2006.01)

(52) U.S. Cl.
CPC .............. *H01L 24/16* (2013.01); *H01L 24/32* (2013.01); *H05K 1/186* (2013.01); *H05K 3/3436* (2013.01); *H01L 2224/16227* (2013.01); *H01L 2224/32225* (2013.01)

(58) Field of Classification Search
CPC ....... H05K 2201/09127; H05K 3/4697; H05K 1/185; H05K 3/30
See application file for complete search history.

(56) References Cited

U.S. PATENT DOCUMENTS

| | | |
|---|---|---|
| 2017/0207196 A1 | 7/2017 | Lee et al. |
| 2018/0226381 A1 | 8/2018 | Lee et al. |
| 2018/0315728 A1* | 11/2018 | Pei ........................ H01L 25/105 |
| 2019/0279925 A1 | 9/2019 | Hsu et al. |

* cited by examiner

EMBEDDING METHODS FOR FINE-PITCH COMPONENTS AND CORRESPONDING COMPONENT CARRIERS

CROSS-REFERENCE TO RELATED APPLICATIONS

This application claims the benefit of the filing date of the Chinese Patent Application No. 202110363356.1, filed Apr. 2, 2021, the disclosure of which is hereby incorporated herein by reference.

TECHNICAL FIELD

Embodiments in the disclosure generally relate to the technical field of component carriers as mechanical support structures for electronic components and for electrically contacting electronic components. Specifically, embodiments of the disclosure relate to methods of embedding a component in a cavity of a component carrier as well as to corresponding component carriers.

TECHNOLOGICAL BACKGROUND

Embedding technologies for printed circuit boards have in recent years significantly contributed to the miniaturization of electronic systems. In one exemplary embedding technology, components are placed into a cavity of a printed circuit board and are subsequently encapsulated. Miniaturization has also been facilitated by the increasing use of fine-pitch components, i.e., components with particularly dense arrangements of electrical contacts. However, these and other approaches for enabling miniaturization have sometimes turned out difficult to reconcile. For example, specific problems arise, when embedding fine-pitch components in a cavity as opposed to surface-mounting such components. In particular, some conventional methods for attaching and/or contacting fine-pitch components are challenging to employ in cavities.

SUMMARY

Thus, there may be a need for efficient manufacturing processes of electronic packages with embedded fine-pitch components as well as for corresponding component carriers.

According to an aspect of the invention, a method of manufacturing a component carrier comprises: (i) embedding a poorly adhesive structure in a stack, wherein the stack comprises at least one electrically conductive layer structure and/or at least one electrically insulating layer structure; (ii) forming a cavity in the stack by removing a stack piece, wherein the stack piece is in part delimited by the poorly adhesive structure; and (iii) selectively exposing a bottom of the cavity by partially removing the poorly adhesive structure.

According to a further aspect of the invention, a component carrier comprises: (i) a stack comprising at least one electrically conductive layer structure and/or at least one electrically insulating layer structure; (ii) a cavity formed in the stack; (iii) an electrically conductive contact structure at a bottom of the cavity; and (iv) a finishing structure on the electrically conductive contact structure. The finishing structure has a smaller lateral extension than the electrically conductive contact structure.

Overview of Embodiments

In the context of the present application, the term "component carrier" may denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The component carrier may comprise a "stack" of at least one electrically insulating layer structure and/or at least one electrically conductive layer structure. The stack may comprise a plurality of layer structures or may even consist of a single layer structure. For example, the component carrier may be a laminate of the mentioned electrically insulating layer structure(s) and electrically conductive layer structure(s), in particular formed by applying mechanical pressure and/or thermal energy. The stack may provide a plate-shaped component carrier capable of providing a large mounting surface for further components and being nevertheless very thin and compact.

A "stack piece" may denote any portion of the stack. The stack piece may comprise only a single or several spatially separate portions of the stack. The stack piece may consist of a continuous and/or simply connected portion of the stack. The stack piece may or may not have a layered structure, in particular corresponding to the layered structure of the stack. The stack piece may be removed by separating the stack piece from the remainder of the stack, e.g., by at least one of routing, cutting, breaking and using a poorly adhesive structure. The stack piece may be removed by circumferentially separating the stack piece, e.g., at a circumferential boundary of the stack piece. When circumferentially separated, the stack piece may be removable from the stack. It may be removable because the boundary between stack piece and the remainder of the stack may be formed by the circumferential boundary, a poorly adhesive structure embedded in the stack and, optionally, an electrically conductive surface, e.g., a copper surface. Removing the stack piece may be referred to as a de-cap step.

The term "layer structure" may denote a continuous layer, a patterned layer or a plurality of non-consecutive islands within a common plane. The different layer structures are stacked on top of each other in a "stacking direction". The stacking direction of the component carrier or stack may be parallel to the surface normal of the main surfaces of the layer structures and/or the main surfaces of the stack. A "main surface" of a layer, layer structure or stack may be either one of those two surfaces, which have the largest extension compared with the other surfaces. The main surface may be defined as a surface perpendicular to the stacking direction. A "side surface" of a layer, layer structure or stack may be any external surface, which is not a main surface. A side surface may be any external surface which is perpendicular to a main surface and/or which extends along the stacking direction. A "vertical direction" may be defined with respect to a given stack as being parallel to the stacking direction. A "horizontal direction" may be defined with respect to a given stack as any direction perpendicular to the stacking direction. The extension of a layer structure along the horizontal plane, in particular along any direction of the horizontal plane, may be larger than the extension of the layer structure in vertical direction, in particular at least five times as large, in particular at least twenty times as large, in particular at least a hundred times as large. One or both main surfaces of a layer, layer structure or stack may or may not be flat.

A "component" may be an electronic component, which may be any physical entity forming part of an electronic system. A component may have one or more electrical terminals or leads, configured for electrically contacting the electronic component. It may be a one-sided component having electrical terminals or leads on only one side of the component, in particular a main surface of the component. It may be a double-sided component having electrical terminals or leads on two sides of the component, in particular on two opposite sides of the component, wherein the opposite sides may both be main surfaces. The component may comprise one or more electronic circuits which may be configured to implement a particular function or subfunction of the component, in particular in the context of the electronic system. The electronic circuitry may be connected to the electrical terminals or leads.

A component may itself comprise one or more subcomponents being themselves components. It may comprise a carrier for mechanical stabilization of the component, as a support structure for different parts of the component and/or for electrically connecting different parts of the component. A component may comprise a housing and/or encapsulation protecting the component from external influences, e.g., mechanical or electromagnetic influences. A component may be an active, passive or electromechanical component.

A component, which is "embedded" in a component carrier, may be defined as any component that is arranged at least partially within the component carrier, e.g., in a recess or a cavity of the component carrier. The embedded component may be arranged completely within the component carrier or only part of the embedded component may be arranged within the component carrier, while another part may protrude from the component carrier. The embedded component may be arranged at least partly in a material, with which the recess or cavity has been filled. This material may have been hardened or cured, thereby fixing the component to the component carrier. When embedded, the entire surface of the component may be in contact with the stack, or at least parts of the surface of the component may not be in contact with the stack. The component may be separated from the stack by a gap which may be defined by the cavity or recess, in which the component is arranged. Alternatively to the above-described embedding of a component, a component may be surface mounted to the stack, e.g., at a top or bottom surface of the stack with respect to the stacking direction or at a side surface of the stack with respect to the stacking direction.

In the context of the present application, a "cavity" in a stack may be defined as a region or space in the stack, which has a different material composition compared with neighboring regions. A cavity in a stack may be defined as any region delimited by a concave portion of the surface of the stack, in particular a concave portion recessed from one or more main surfaces and/or one or more side surfaces of the stack. A cavity in a stack may be defined as any region, where the stack deviates from a cuboid outline surrounding the stack. The cavity may be a blind hole. It may be a through-hole.

In particular, a cavity may be defined as an empty or unfilled region or space in the stack. However, a cavity may also be filled with one or several materials, while the composition and/or arrangement of the materials in the cavity differ from the composition and/or arrangement of the surrounding part of the stack. The one or several materials in the cavity may not have a layered structure or may have a different layered structure than the surrounding regions of the stack. A cavity may denote a space or region in the stack, which was empty or unfilled at some point of the manufacturing process, but which subsequently has been filled, e.g., with a component and/or a filling material. The outline of the cavity may correspond to the outline of the stack piece.

A "bottom" of a cavity may be defined as a delimiting surface of the cavity, in particular a surface delimiting the cavity from the stack. The delimiting surface may be flat or at least substantially flat, it may also be curved. The delimiting surface may be orthogonal to the stacking direction of the stack. The delimiting surface may be formed by a main surface of one or more layer structures of the stack, e.g., by parts of a main surface of an electrically insulating layer structure and/or parts of a main surface of an electrically conductive layer structure. The bottom of the cavity may border on, in particular may be fully enclosed by, one or more side surfaces of the cavity.

The bottom of the cavity may comprise electrically conductive structures, in particular one or more electrical contacts, one or more pads and/or one or more traces. The bottom of the cavity may be formed by an electrically insulating surface of the stack, on which electrically conductive structures may be arranged. On the bottom of the cavity, a poorly adhesive structure may be arranged. The poorly adhesive structure may cover the bottom of the cavity, in particular an electrically insulating surface and/or one or more electrically conductive structures on the bottom of the cavity.

A "structure" may be delimited from its surroundings by a clearly defined boundary. It may comprise one or more pieces, which may each be materially continuous. The pieces may be spatially separate, they may for example form part of a layered structure. The structure may be homogeneously formed from one material or it may comprise several materials, which may, e.g., be arranged in layers. The structure may be or comprise a layered structure or a layer. An "electrically conductive structure" may be any structure comprising or consisting of electrically conductive material, e.g., copper or gold. An electrically conductive structure may be an electrically conductive layer structure or it may form part of an electrically conductive layer structure.

An electrically conductive structure, in particular an "electrically conductive contact structure," may comprise or consist of one or more electrical contacts, in particular electrical contacts arranged at a surface of the stack and/or configured to externally connect the stack. For example, the electrically conductive structure may comprise or consist of one or more pads. A "pad" may be defined as a structure of electrically conductive material, in particular comprising copper, by means of which the stack may be externally connected. The structure may form a surface portion of the stack, e.g., in a cavity of the stack and/or on an outer surface of the stack. The surface portion may be flat. It may or may not be continuous and/or simply connected. An electrical contact or a pad may be configured for mounting a component thereon and/or for electrically connecting the stack with the component. For example, the electrical contact or the pad may be configured for attaching, in particular soldering, a component to the stack.

Alternatively or additionally, the electrically conductive structure, in particular the electrically conductive contact structure, may comprise one or more traces. A "trace" may be defined as an elongated structure of electrically conductive material, in particular comprising copper. The structure may form a surface portion of the stack, e.g., in a cavity of the stack and/or on an outer surface of the stack. The surface portion may be flat. It may or may not be continuous and/or simply connected. The trace may be configured to electrically connect different parts of the stack, in particular parts arranged at respective ends of the trace. It may not be configured for mounting a component thereon.

A "finishing structure," e.g., a surface finish, may be defined as any material applied to a surface of the stack, in particular an outer surface of the stack. It may be applied to a surface of the stack delimiting a cavity of the stack, in particular to a bottom of the cavity. It may be applied selectively to an electrically conductive structure arranged at the surface of the stack, in particular to one or more pads and/or one or more traces. The electrically conductive structure to which the finishing structure is applied may comprise or consist of copper. The finishing structure may form an outermost structure on a surface of the stack, e.g., on a bottom of a cavity of the stack, in particular an outermost electrically conductive structure.

The finishing structure may consist of a single, materially homogeneous layer or it may comprise a plurality of layers. All layers may or may not be electrically conductive. The finishing structure may be thinner than an underlying structure, on which the finishing structure is applied, in particular half as thin or thinner, in particular a fifth as thin or thinner. On the bottom of the cavity, the finishing structure may be arranged exclusively on top of the electrically conductive contact structure. It may or may not be applied to side surfaces of the electrically conductive contact structure.

The finishing structure and/or a layer of the finishing structure may be applied as a film and/or as a coating. The finishing structure and/or a layer of the finishing structure may be applied by at least one of a plating process, in particular electroless plating, and an immersion process. The finishing structure may comprise at least one of nickel, palladium, and gold. It may be an ENIG (electroless nickel, immersion gold) finishing structure or an ENEPIG (electroless nickel, electroless palladium, immersion gold) finishing structure. ENIG and ENEPIG may be particularly suitable for connecting fine-pitch components.

The finishing structure may be configured to protect a surface of the stack, e.g., prevent or reduce corrosion of the surface, in particular oxidation. Alternatively or in addition, the finishing structure may be configured to facilitate electrically contacting the surface of the stack, e.g., by enhancing solderability and/or component weldability. The finishing structure may be configured so that a contact element, e.g., a solder ball, can be applied. It may be configured for thermal compression bonding, wherein two metal structures such as two gold structures may be bonded by applying force and heat simultaneously. The finishing structure may provide an interface between the stack and a component mounted to the stack.

A "lateral extension" may be defined as a two-dimensional extension or one-dimensional extension parallel to the bottom of the cavity and/or orthogonal to the stacking direction of the stack. It may be defined as a two-dimensional or one-dimensional extension parallel to a main surface, in particular an upper main surface, of the finishing structure and/or parallel to a main surface, in particular an upper main surface, of the electrically conductive contact structure.

A "smaller" lateral extension may mean that the overall lateral extensions of the respective structures are smaller and/or it may mean that the lateral extensions are smaller for all corresponding pieces or elements of the finishing structure and the contact structure. It may mean that the lateral extension is smaller for at least one piece or element of the finishing structure compared with the respective piece or element of the contact structure. For example, it may mean that the lateral outline of the finishing structure is contained within the lateral outline of the contact structure. It may mean that the lateral outline of the finishing structure does not cross and/or does not touch the lateral outline of the contact structure. It may mean that there is a minimum distance, e.g., of 5 µm, between the lateral outline of the finishing structure and the lateral outline of the contact structure. The contact structure may protrude beneath the finishing structure, e.g., by at least this minimum distance.

A "poorly adhesive structure" may be any structure, which is poorly adhesive for at least one material adjacent to or touching the poorly adhesive structure. It may be poorly adhesive for all materials surrounding the poorly adhesive structure. It may be less adhesive for one material adjacent to or touching the poorly adhesive structure than for all other materials adjacent to or touching the poorly adhesive structure. The poorly adhesive structure may be poorly adhesive for an adjacent surface portion of the stack piece. It may be configured to detach from the stack piece, when the stack piece is removed, in particular to easily detach by a small mechanical force.

The poorly adhesive structure may define an interface between a bottom of the cavity and the stack piece. A surface portion of the poorly adhesive structure may define the bottom of a cavity or only a part of the bottom of the cavity. A different surface portion of the poorly adhesive structure may define a surface portion of the stack piece. The poorly adhesive structure may be a layer structure or a layer. It may be 5 to 40 µm thick, but may also be thicker or thinner. It may or may not be continuous and/or simply connected.

The poorly adhesive structure may be a sacrificial structure, which is used only during manufacture of the component carrier, but which does not form part of the finished component carrier. The poorly adhesive structure may be a release layer. The poorly adhesive structure may be easily removable from the bottom of the cavity, e.g., it may be washable. It may be or may comprise an ink.

"Embedding" the poorly adhesive structure in the stack may refer to any process, wherein the poorly adhesive structure is arranged within the stack, in particular during manufacture of the stack. It may for example be arranged on the main surface of an electrically insulating layer structure and/or the main surface of an electrically conductive layer structure, before a further electrically insulating layer structure is arranged, in particular laminated, on the poorly adhesive structure and, optionally, the electrically insulating layer structure and/or the electrically conductive layer structure. The poorly adhesive structure may be fully or only partially embedded in the stack. It may or may not form part of an outer surface of the stack.

"Partially removing" the poorly adhesive structure may refer to any process, by which material of the adhesive structure is removed, while other material of the adhesive structure remains. Partially removing may comprise forming holes in the poorly adhesive structure, in particular through-holes. The through-holes may have any form, e.g., may be circular. Partially removing may comprise exposing a surface underneath the poorly adhesive structure, in particular a bottom of the cavity and/or a surface of the electrically conductive contact structure. Partially removing may for example comprise drilling holes in the poorly adhesive structure, e.g., laser drilling.

An advantage of the above-described method of manufacturing a component carrier and of the corresponding component carrier may be that the embedding of fine-pitch components in a component carrier is facilitated, i.e., of components with an especially dense arrangement of electrical contacts. For example, conventional processes for forming finishing structures may not be available in cavities or at least be challenging to apply in cavities. As already mentioned, both the embedding of components in component carriers and the use of fine-pitch components are advantageous for the miniaturization of electronic packages comprising one or more electronic components.

Having a smaller lateral extension of the finishing structure compared with the underlying contact structure may allow for using components with an especially small pitch. Conventionally, the finishing structure extends over the whole underlying contact structure and may even extend beyond the underlying contact structure. For example, when the finishing structure is applied conventionally, due to the nature of the respective processes, it may also be applied to side surfaces of the underlying contact structure. This may increase the lateral extension of the combined finishing and contact structure, which may increase the smallest possible pitch of embedded components.

Selectively exposing a bottom of the cavity by partially removing the poorly adhesive structure may be advantageous because the poorly adhesive structure serves a two-fold function. First, it supports the formation of the cavity in the stack by enabling the removal of a stack piece defining the cavity. Second, it serves as a mask layer for selectively applying material to the bottom of the cavity and/or for selectively removing material from the bottom of the cavity. Such a two-fold function may be particularly efficient for embedding components in a component carrier. It may reduce the number of required process steps and/or may be especially economical with respect to the use of materials.

According to an embodiment of the invention, the method further comprises applying a structure, in particular a finishing structure, to the exposed part of the bottom of the cavity. Thus, the partially removed adhesive structure is used as a mask layer for forming the finishing structure. "Applying" may refer to any process, by which a structure is arranged or formed. When applied, the structure may attach to an underlying structure.

This embodiment may be advantageous as the described method may provide a particularly simple and efficient way of applying a finishing structure in a cavity, whereas conventional methods for applying finishing structure may be more challenging to apply in cavities. Of course, the application of finishing structures in cavities may be necessary for mounting and electrically connecting components in cavities.

According to a further embodiment of the invention, the finishing structure is electrically conductive. This may be advantageous because electrical conductivity of finishing structures may be required so that an electrical connection between component and stack can be established via the finishing structure.

According to a further embodiment of the invention, the finishing structure is applied to an electrically conductive contact structure at the bottom of the cavity. The electrically conductive contact structure may be exposed from the poorly adhesive structure. It may form part of the at least one electrically conductive layer structure of the stack. Such an embodiment may be advantageous, because a finishing structure may protect the electrically conductive contact structure and/or may enable electrically connecting the stack via the electrically conductive contact structure.

According to an exemplary embodiment, the contact structure comprises alignment pads, which may be on the same level as other elements of the contact structure. The alignment pads may be used for processing in the cavity, e.g., of the poorly adhesive structure, the contact structure and/or the finishing structure.

According to a further embodiment of the invention, the finishing structure has a smaller lateral extension than the electrically conductive contact structure. As already mentioned, such a smaller lateral extension may allow for embedding components with a smaller pitch.

According to an exemplary embodiment, the electrically conductive contact structure protrudes laterally by at least 5 µm beneath the finishing structure.

According to an exemplary embodiment, the electrically conductive contact structure, in particular a pad of the electrically conductive contact structure, has a lateral extension of less than 50 µm, in particular less than 10 µm. All pads of the electrically conductive contact structure may have a lateral extension of less than 50 µm, in particular less than 10 µm. Such small pads may be advantageous for contacting fine-pitch components.

According to a further embodiment of the invention, the material composition of the electrically conductive contact structure differs from the material composition of the finishing structure. For example, the main ingredient of the electrically conductive contact structure may be copper, while the main ingredient of the finishing structure may not be copper. Such an embodiment may be advantageous, because the materials of the finishing structure may allow for specific functions of the finishing structure such as protecting the underlying contact structure and/or providing good solderability.

According to a further embodiment of the invention, a center-to-center distance between two separate elements of the finishing structure and/or between two separate elements of the electrically conductive contact structure is smaller than 100 µm, in particular smaller than 50 µm, in particular smaller than 30 µm. Such separate elements or pieces of the electrically conductive contact structure may for example be pads. The separate elements or pieces of the finishing structure may each correspond to an underlying element, e.g., pad, of the contact structure.

A "pitch" may be defined as the sum of a pad diameter plus the distance between adjacent pads. It may be defined as the center-to-center distance between electrical contacts, between contact pads and/or between contact pins, e.g., the smallest center-to-center distance or an average center-to-center distance. The electrical contacts, contact pads and/or contact pins may form part of a stack and/or a component. They may be arranged at the bottom of a cavity. They may be configured to electrically connect the stack to the component.

Such an embodiment may be advantageous because the methods described in this document may allow for embedding components with an especially small pitch, e.g., in comparison with methods which do not use a mask layer or use a mask layer, which is not formed by a poorly adhesive structure.

According to an exemplary embodiment, an average center-to-center distance between adjacent elements of the finishing structure and/or between adjacent elements of the electrically conductive contact structure is smaller than 100 µm, in particular smaller than 50 µm, in particular smaller than 30 µm.

According to an exemplary embodiment, a smallest center-to-center distance between adjacent elements of the finishing structure and/or between adjacent elements of the electrically conductive contact structure is smaller than 100 µm, in particular smaller than 50 µm, in particular smaller than 30 µm.

According to a further embodiment of the invention, the finishing structure comprises a plurality of sublayers. This embodiment may be advantageous, because different sublayers may serve different functions such as protecting against external influences, e.g., against oxidation, providing good solderability or reducing migration of material from adjacent layers.

According to a further embodiment of the invention, the finishing structure comprises at least one of nickel, gold, palladium, tin and an organic solderability preservative. Such materials may be advantageous because they may be suitable for one or more of the functions mentioned in connection with the previous embodiment.

According to a further embodiment of the invention, the finishing structure is applied by at least one of a plating process, an electroless plating process, an electroless deposition process and an immersion process. One or more of these processes may be especially advantageous for applying finishing structures, e.g., for providing thin layers, for attaching material to electrically conductive structures, and/or for providing flat surfaces.

According to a further embodiment of the invention, the poorly adhesive structure is resistant against materials, in particular all materials, used in the plating process and/or in the immersion process. To this purpose, it may consist of or comprise a resin-type material such as solder resist material and/or epoxy-based build-up film material. Such an embodiment may be particularly advantageous, when these processes are used for applying a finishing structure, while employing the poorly adhesive structure as a mask layer, as was described in the previous embodiment.

According to a further embodiment of the invention, the method further comprises applying a solder structure, e.g., a solder ball, to the finishing structure. Accordingly, the finishing structure may provide a surface with good solderability, in particular better solderability than a copper surface. Such an embodiment may be particularly advantageous for attaching and electrically connecting a component to the finishing structure.

According to a further embodiment of the invention, the method further comprises mounting, in particular compression bonding, a component in the cavity using the finishing structure as an interface between the stack and the component. The component may in particular be a fine-pitch component, e.g., having a pitch smaller than 100 µm, in particular smaller than 50 µm, in particular smaller than 30 µm. This embodiment may be advantageous, because the methods described in this document may be particularly suited for embedding components in a cavity of a component carrier, in particular for embedding fine-pitch components.

According to a further embodiment of the invention, the component is a double-sided component. Such an embodiment may be advantageous, because the component may be electrically contacted not only by contacts at the bottom of the cavity, but for example by additional contacts on the opposite side of the component. Using double-sided components may be a further important measure to miniaturize electronic packages.

According to a further embodiment of the invention, the poorly adhesive structure is partially removed by laser processing, e.g., laser drilling. Laser processing may be particularly suitable to partially remove the poorly adhesive structure and selectively expose the bottom of the cavity, in particular for forming holes to expose electrical contacts at the bottom of the cavity. Laser processing may be particularly exact in comparison with other methods.

According to an exemplary embodiment, the finishing structure has tapering sidewalls. These may result from corresponding sidewalls in the partially removed poorly adhesive structure. They may result from laser processing of the poorly adhesive structure and they may be advantageous for applying the finishing structure.

According to a further embodiment of the invention, the method further comprises removing the poorly adhesive structure before completing manufacture of the component carrier, in particular before mounting a component in the cavity. Thus, the poorly adhesive structure may be a sacrificial structure. The poorly adhesive structure may be removed after applying the finishing structure and before mounting the component. For example, the poorly adhesive structure may be washed off. Such an embodiment may be advantageous because the poorly adhesive structure could negatively impact the stability of the finished component carrier and/or may render difficult mounting the component.

According to an exemplary embodiment, the poorly adhesive structure is not removed, but forms part of the finished component carrier and/or a finished electronic package comprising the component carrier and a component embedded therein.

According to a further embodiment of the invention, a sidewall of the cavity is at least partially covered with a shielding structure. The sidewall may be adjacent to the bottom of the cavity. It may form an angle between 50° and 110° with the bottom of the cavity, in particular be perpendicular to the bottom of the cavity. The shielding structure may consist of or comprise a metal. It may be a layer structure, e.g., a thin film. It may be configured to shield neighboring regions of the stack during processing of the cavity, e.g., during structuring of the poorly adhesive structure, during application of the finishing structure, during removal of the poorly adhesive structure and/or during mounting the component. Furthermore, the shielding structure may be configured to shield a component mounted in the cavity from surrounding regions in the stack, e.g., with respect to electrical signals.

According to a further embodiment of the invention, the method further comprises (i) forming at least one trench in the selectively exposed bottom of the cavity; and (ii) filling the at least one trench with an electrically conductive material to form an electrically conductive contact structure. A finishing structure may then be formed on the electrically conductive contact structure. Alternatively or in addition, the electrically conductive contact structure in the trench could be covered by a dielectric. The poorly adhesive structure may thus be used as a mask layer for forming trenches, for filling trenches and/or for forming the finishing structure. As a result, the lateral extension of the finishing structure may or may not be the same as the lateral extension of the underlying contact structure. This embodiment illustrates that the poorly adhesive structure can serve as mask layer for a large variety of processes and thus shows the flexibility of the methods described in this document.

According to an exemplary embodiment, the at least one electrically insulating layer structure of the stack consists of or comprises a prepreg material, a photoimageable dielectric (PID) and/or an epoxy-based build-up film material such as ABF material (Ajinomoto Build-up Film®). Ajinomoto Build-up Film® is a registered mark of the Ajinomoto Co., Inc. of Tokyo, Japan. This embodiment may be advantageous as it illustrates that components may be embedded in various materials according to the methods described in this document.

In the following further considerations are presented which may be relevant at least for some embodiments of the invention.

In an embodiment, the component carrier is shaped as a plate. This may contribute to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connection. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylether PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay could be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

Some embodiments have been described with reference to apparatus type claims whereas other embodiments have been described with reference to method type claims. However, a person skilled in the art will gather from the above and the following description that, unless otherwise indicated, any combination of features relating to method type claims with features relating to apparatus type claims is disclosed with this document, both with respect to the apparatus as well as with respect to the method.

The aspects defined above and further aspects of the present invention are apparent from the examples of embodiment to be described hereinafter and are explained with reference to the examples of embodiment.

DETAILED DESCRIPTION OF ILLUSTRATED EMBODIMENTS

Figure 1:
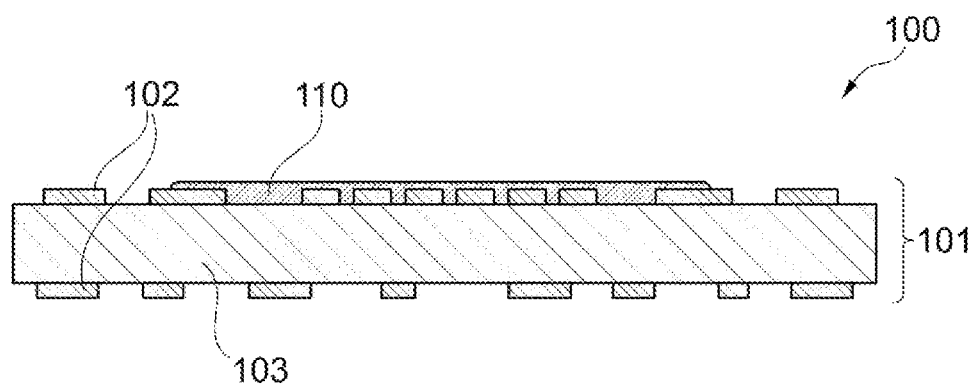
FIG. 1, FIG. 2, FIG. 3, and FIG. 4 show structures obtained during manufacture of a component carrier according to an exemplary embodiment of the invention.

The illustrations in the drawings are schematically presented. In different drawings, similar or identical elements are provided with the same reference signs. For the sake of clarity and comprehensibility, reference signs are sometimes omitted for those features, for which reference signs have already been provided in earlier figures.

Before, referring to the drawings, exemplary embodiments will be described in further detail, some basic considerations will be summarized based on which exemplary embodiments of the invention have been developed.

A basic idea of embodiments of the invention is to reduce pitch for embedding a component, in particular a double-sided component, in one or more build up layers of a component carrier. It is proposed to use 2.5D technology, e.g., to create a cavity, in which the component is embedded. A poorly adhesive structure such as a release layer in the cavity would have two functions: first, as a release layer and second, for applying a finishing structure, e.g., for the surface finishing of an underlying contact structure, e.g., of pads such as interconnection pads. The steps could be: create cavity and de-cap, partly remove, e.g., by laser drilling, the poorly adhesive structure on the pads, perform surface finishing on the pads, strip the poorly adhesive structure. Thus, the poorly adhesive structure is used as a mask for surface finishing. This process flow could limit the exposed area on the pad for surface finishing and thus allow fine pitch. By contrast, according to conventional methods, the pads may be plated with surface finish entirely thus adding around 14 μm in total to the pad diameter.

These and similar methods may be advantageous because the poorly adhesive structure may be used as a protective foil during plating. Also, the method may enable to obtain fine pitch lines, in particular where soldering is not possible. It may enable gold plating of an electrically conductive contact structure in order to mount components by thermal compression bonding. Finally, signals may be shielded due to the sidewalls of the cavity, in particular due to shielding structures on these sidewalls.

FIGS. 1 to 4 show structures obtained during manufacture of a component carrier 100 according to an exemplary embodiment of the invention. In FIG. 1, a stack 101 is shown with an insulating layer structure 103 partially covered on opposite sides by respective electrically conductive layer structures 102. The stack 101 may for example be a core. A poorly adhesive structure 110 covers parts of one of the electrically conductive layer structures 102 and of a corresponding main surface of the insulating layer structure 103, on which this electrically conductive layer structure 102 is arranged. The electrically conductive layer structure 102, in particular where it is covered by the poorly adhesive structure 110, includes pads and traces.

Figure 2:
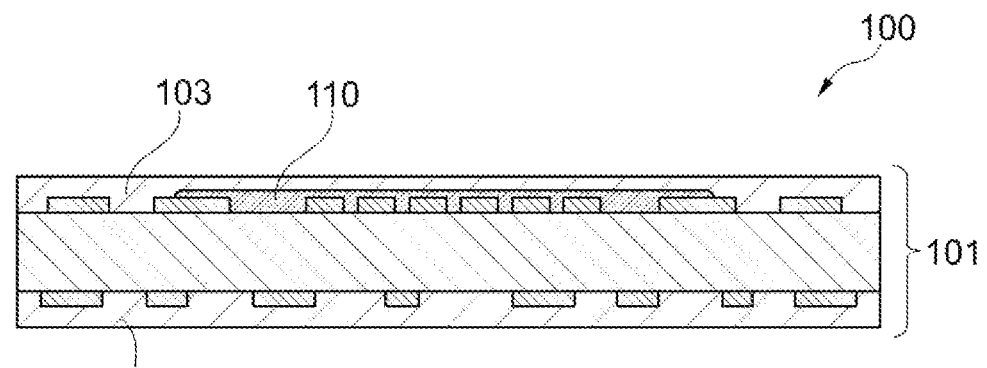
Figure 3:
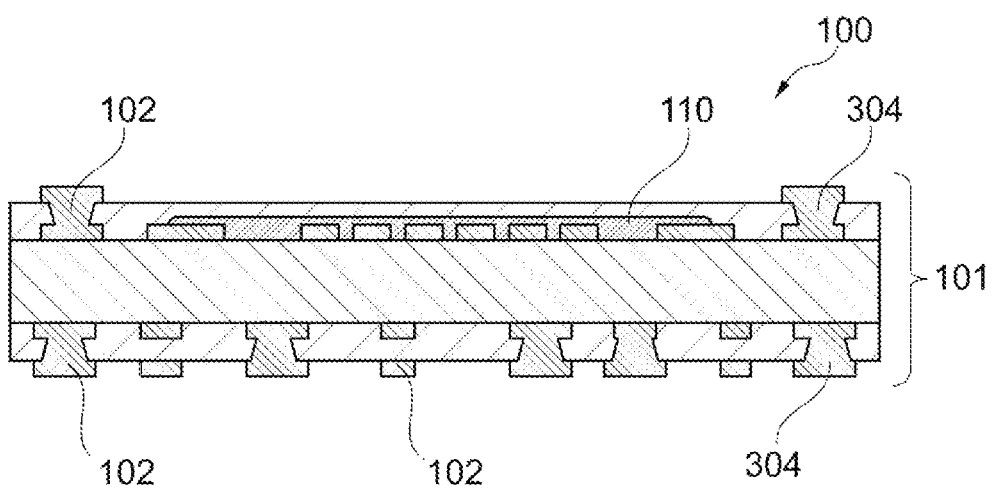

In FIG. 2, two further electrically insulating layer structures 103 forming part of the stack 101 are applied, e.g., laminated, on opposite sides of the structure shown in FIG. 1. One of the further electrically insulating structures 103 covers the poorly adhesive structure 110 such that the poorly adhesive structure 110 is fully embedded in the stack 101. In FIG. 3, two further electrically conductive layer structures 102 forming part of the stack 101 are applied, e.g., laminated, on opposite sides of the structure shown in FIG. 2. Vias 304 are formed between different electrically conductive layer structures 102. Still further electrically insulating layer structures 103 forming part of the stack 101 are applied in a step between FIGS. 3 and 4.

Figure 4:
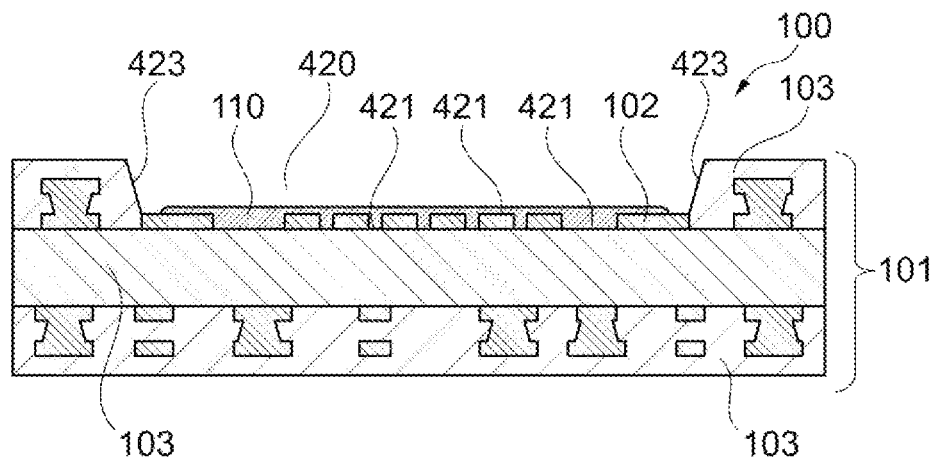

In FIG. 4, a cavity 420 is formed by removing a stack piece, wherein the stack piece is in part delimited by the poorly adhesive structure 110. The stack piece corresponds to the portion of the stack 101 previously located, where the cavity 420 is shown in FIG. 4. The cavity 420 is delimited from the stack 101 by a bottom 421 of the cavity 420 and adjacent sidewalls 423 of the cavity 420. The bottom 421 of the cavity 420 is formed by a main surface of an electrically insulating layer structure 103 and by an electrically conductive layer structure 102 arranged thereon. On the bottom 421 of the cavity 420, the poorly adhesive structure 110 is arranged. A part of the mentioned electrically conductive layer structure 102 at an outer portion of the bottom 421 of the cavity 420 is not covered by the poorly conductive adhesive structure 110. Thus, a gap is formed between sidewalls 423 and the poorly adhesive structure 110.

Figure 5:
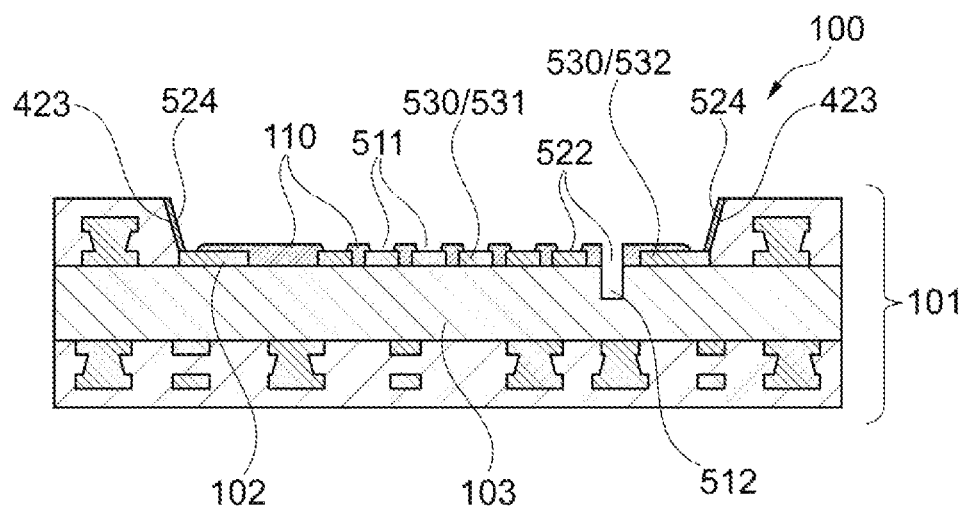
FIG. 5 shows a component carrier with a bottom of a cavity partially exposed from a poorly adhesive structure according to an exemplary embodiment of the invention.

In FIG. 5, shielding structures 524 are shown covering sidewalls 423 of the cavity 420. Holes 511 have been formed in the poorly adhesive structure 110 exposing parts 522 of the bottom 421 of the cavity 420. In particular, pads 531 and traces 532 of an electrically conductive contact structure 530 have been partially exposed, wherein the contact structure 530 forms part of an electrically conductive layer structure 102 of the stack 101. Furthermore, a surface portion 522 of an electrically insulating layer structure 103 of the stack 101 has been exposed from the poorly adhesive structure 110 and a trench 512 has been formed in this surface portion 522.

Figure 6:
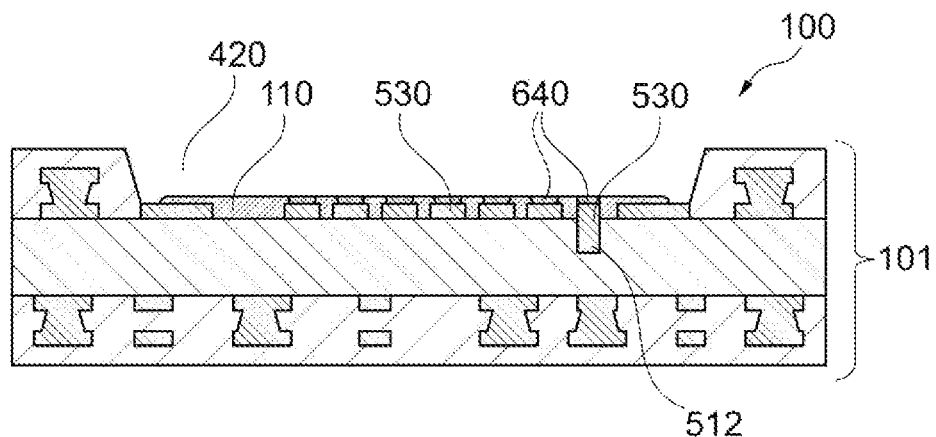
FIG. 6 shows a component carrier with a finishing structure applied to a contact structure partially exposed from a poorly adhesive structure according to an exemplary embodiment of the invention.

In FIG. 6, a finishing structure 640 is formed on the exposed parts 522 of the bottom 421 of the cavity 420, in particular on the exposed pads 531 and traces 532 of the electrically conductive contact structure 530. Furthermore, the trench 512 has been filled with electrically conductive material to form part of the electrically conductive contact structure 530. On the electrically conductive contact structure 530 in the trench 512, a finishing structure 640 has also been applied.

Figure 7:
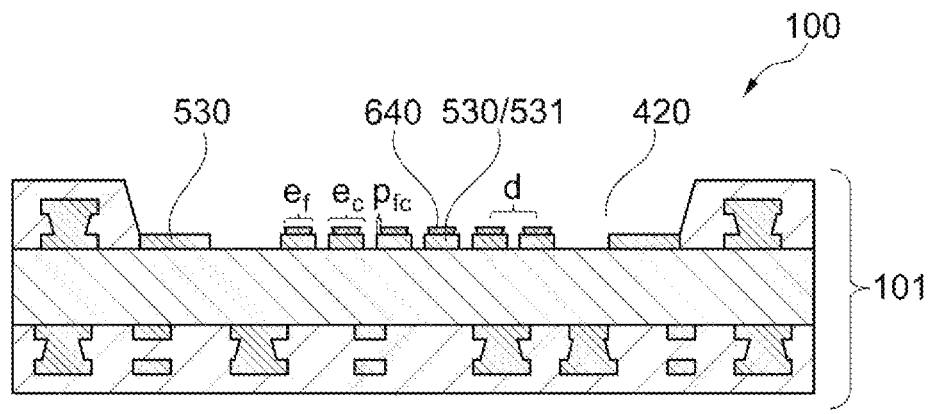
FIG. 7 shows a component carrier with a contact structure and a finishing structure at the bottom of a cavity according to an exemplary embodiment of the invention.

In FIG. 7, the remaining poorly adhesive structure 110 has been removed, e.g., washed off. The resulting component carrier 100 comprises a stack 101 with several electrically conductive layer structure 102 and with several electrically insulating layer structure 103. A cavity 420 is formed in the stack 101. At a bottom 421 of the cavity 420, an electrically conductive contact structure 530 is arranged. A finishing structure 640 partly covers the electrically conductive contact structure 530. For each pad 531 of the electrically conductive contact structure 530, a lateral extension $e_f$ of the finishing structure 640 is smaller than a lateral extension $e_c$ of the pad 531. In other words, the contact structure protrudes by length $p_{fc}$ beneath the finishing structure 640, where $p_{fc}$ may be the minimum protrusion length. As has been repeatedly pointed out in this document, this smaller extension of the finishing structure 640 may allow for a smaller pitch, characterized by the center-to-center distance d between adjacent elements of the finishing structure 640 and/or adjacent elements of the contact structure 530 such as pads 531. For a pitch of 30 μm, $e_f$ may be 10 μm, $e_c$ may be 20 μm and/or $p_{fc}$ may be 5 μm. For a pitch smaller than 30 μm, $e_f$ may be smaller than 10 μm, $e_c$ may be smaller than 20 μm and/or $p_{fc}$ may be smaller than 5 μm.

Figure 8:
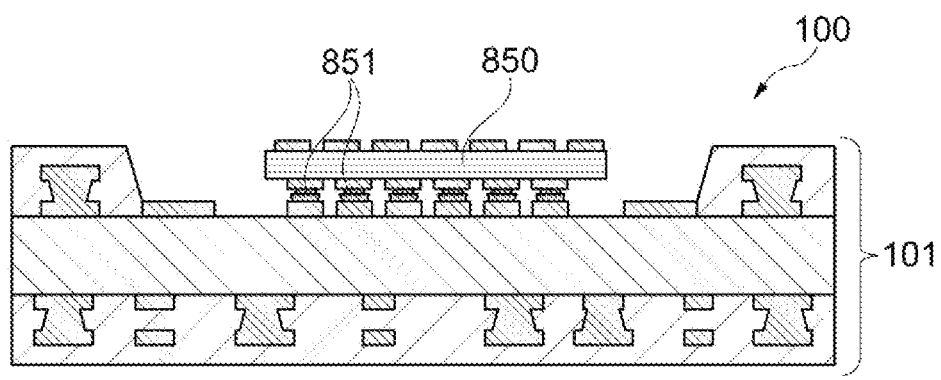
FIG. 8, FIG. 9, and FIG. 10 show structures obtained during mounting of a component in a cavity of a component carrier according to an exemplary embodiment of the invention.
Figure 9:
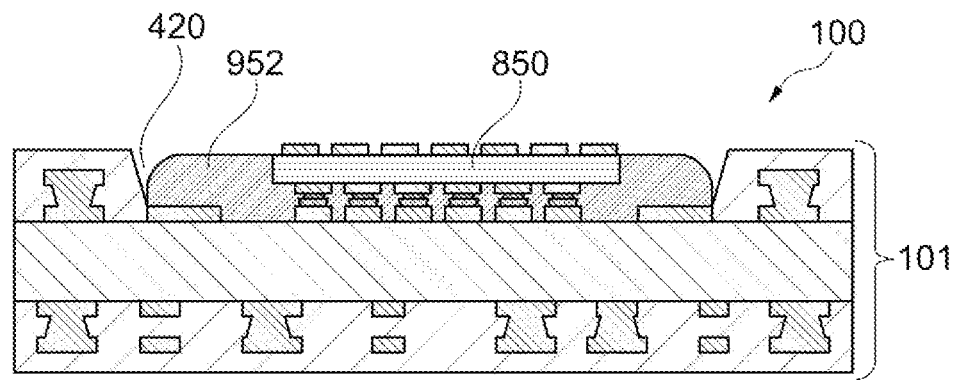
Figure 10:
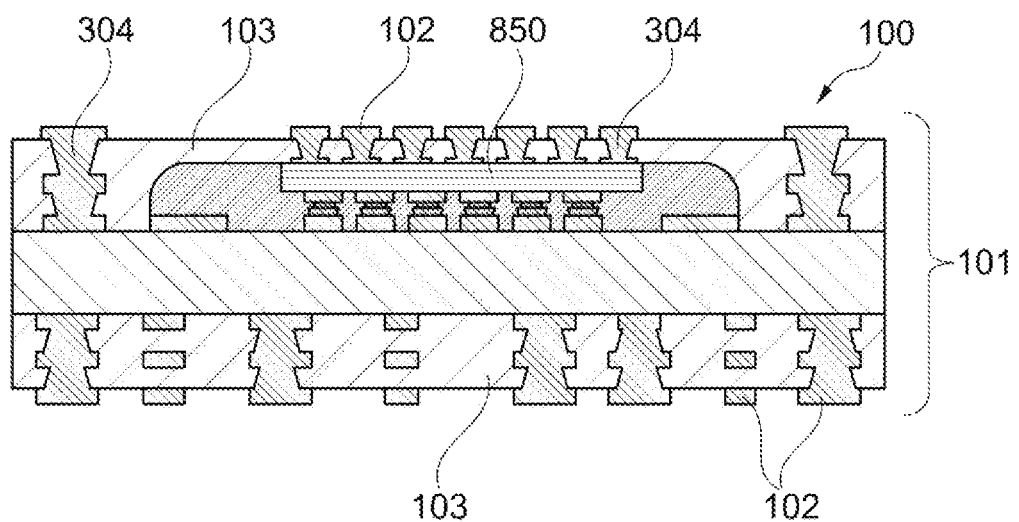

FIGS. 8 to 10 show structures obtained during mounting of a component 850 in a cavity 420 of a component carrier 100 according to an exemplary embodiment of the invention. In FIG. 8, a double-sided component 850, in particular its electrical contacts, is attached to the finishing structure 640. With the finishing structure 640 serving as an interface, the component 850 is electrically connected to the electrically conductive contact structure 530 and thus to electrical circuitry of the stack 101. The component 850 may be attached and electrically connected by means of a solder structure 851. It may be attached and electrically connected by thermal compression bonding, e.g., if the finishing structure 640 comprises gold. In FIG. 9, an underfill 952 is provided in the cavity 420 for the component 850. In FIG. 10, further electrically insulating layer structures 103 and further electrically conductive layer structure 102 are applied, e.g., laminated, to both sides of the structure shown in FIG. 9. In particular, a further electrically insulating structure 103 is applied, e.g., laminated, over the cavity 420 fully covering the double-sided component 850. Vias 304 are formed in this further electrically insulating layer structure 103 electrically contacting the double-sided component 850 on a side opposite to the side contacted by the electrically conductive contact structure 530. A package results with a fully embedded double-sided fine-pitch component 850.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

LIST OF REFERENCE SIGNS 100 component carrier
101 stack
102 electrically conductive layer structure
103 electrically insulating layer structure
110 poorly adhesive structure
304 via
420 cavity
421 bottom
423 sidewall
511 hole in poorly adhesive structure
512 trench
522 exposed part of bottom
524 shielding structure
530 electrically conductive contact structure
531 pad
532 trace
640 finishing structure
850 component
851 solder structure
952 underfill
$e_f$ lateral extension of finishing structure
$e_c$ lateral extension of contact structure
$p_{fc}$ protrusion of contact structure beneath finishing structure
d center-to-center distance

The invention claimed is:

1. A method of manufacturing a component carrier, the method comprising:
 embedding a poorly adhesive structure in a stack, wherein the stack comprises at least one electrically conductive layer structure and/or at least one electrically insulating layer structure;
 forming a cavity in the stack by removing a stack piece, wherein the stack piece is in part delimited by the poorly adhesive structure; and
 selectively exposing a bottom of the cavity by partially removing the poorly adhesive structure.

2. The method of claim 1, further comprising:
 applying a finishing structure to the exposed part of the bottom of the cavity.

3. The method of claim 2, wherein the finishing structure is electrically conductive.

4. The method of claim 3, wherein the finishing structure is applied to an electrically conductive contact structure at the bottom of the cavity.

5. The method of claim 4, wherein the finishing structure has a smaller lateral extension than the electrically conductive contact structure.

6. The method of claim 4, wherein the material composition of the electrically conductive contact structure differs from the material composition of the finishing structure.

7. The method of claim 2, wherein a center-to-center distance between two separate elements of the finishing structure is smaller than 100 μm.

8. The method of claim 2, wherein the finishing structure comprises a plurality of sublayers.

9. The method of claim 2, wherein the finishing structure comprises at least one of nickel, gold, palladium, tin and an organic solderability preservative.

10. The method of claim 2, wherein the finishing structure is applied by at least one of a plating process, an electroless plating process, and an immersion process.

11. The method of claim 10, wherein the poorly adhesive structure is resistant against materials used in the plating process and/or in the immersion process.

12. The method of claim 2, further comprising:
 applying a solder structure to the finishing structure.

13. The method of claim 2, further comprising:
 mounting a component in the cavity using the finishing structure as an interface between the stack and the component.

14. The method of claim 13, wherein the component is a double-sided component.

15. The method of claim 1, wherein the poorly adhesive structure is partially removed by laser processing.

16. The method of claim 1, further comprising:
 removing the poorly adhesive structure before completing manufacture of the component carrier.

17. The method of claim 1, wherein a sidewall of the cavity is at least partially covered with a shielding structure.

18. The method of claim 1, further comprising:
 forming at least one trench in the selectively exposed bottom of the cavity; and filling the at least one trench with an electrically conductive material to form an electrically conductive contact structure.

* * * * *